(12) United States Patent
Watanabe et al.

(10) Patent No.: US 8,519,795 B2
(45) Date of Patent: Aug. 27, 2013

(54) HIGH FREQUENCY POWER AMPLIFIER

(75) Inventors: Shintaro Watanabe, Tokyo (JP); Kazuhiro Iyomasa, Tokyo (JP); Hiroaki Maehara, Tokyo (JP); Jun Takaso, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 20 days.

(21) Appl. No.: 13/428,580

(22) Filed: Mar. 23, 2012

(65) Prior Publication Data

US 2012/0293257 A1 Nov. 22, 2012

(30) Foreign Application Priority Data

May 19, 2011 (JP) ................... 2011-112224

(51) Int. Cl.
*H03F 3/68* (2006.01)
(52) U.S. Cl.
USPC ............................. 330/295; 330/51; 330/302
(58) Field of Classification Search
USPC ............... 330/51, 151, 124 R, 295, 302, 310
See application file for complete search history.

(56) References Cited

U.S. PATENT DOCUMENTS

| | | | |
|---|---|---|---|
| 5,548,246 A | 8/1996 | Yamamoto et al. | |
| 6,674,323 B2 * | 1/2004 | Kagaya et al. | 330/51 |
| 6,865,399 B2 * | 3/2005 | Fujioka et al. | 455/553.1 |
| 8,207,790 B2 * | 6/2012 | Asada et al. | 330/295 |
| 8,269,561 B1 * | 9/2012 | Park et al. | 330/124 R |
| 2008/0088376 A1 | 4/2008 | Tateoka et al. | |

FOREIGN PATENT DOCUMENTS

| | | |
|---|---|---|
| JP | 7-336168 A | 12/1995 |
| JP | 2003-347942 A | 12/2003 |
| JP | 2008-118624 A | 5/2008 |

OTHER PUBLICATIONS

Kawakami, K. et al.; "A Switch-Type Power Amplifier and Its Application to a CDMA Cellphone", *Proceedings of the 36th European Microwave Conference*, (Sep. 2006), pp. 348-351.

* cited by examiner

*Primary Examiner* — Khanh V Nguyen
(74) *Attorney, Agent, or Firm* — Leydig, Voit & Mayer, Ltd.

(57) ABSTRACT

A high frequency power amplifier includes: a first transistor for amplifying an input high-frequency signal; a second transistor for amplifying an output signal of the first transistor; a third transistor connected in parallel with the first transistor and for amplifying the input high-frequency signal; a first switching element connected between an output of the first transistor and an input of the second transistor; a second switching element connected between an output of the third transistor and the first switching element; third and fourth switching elements connected in series between the output of the first transistor and an output of the second transistor, and between the second switching element and the output of the second transistor; and a first capacitor connected between the third switching element and the fourth switching element.

6 Claims, 3 Drawing Sheets

HIGH FREQUENCY POWER AMPLIFIER

BACKGROUND OF THE INVENTION

1. Field of the Invention

The present invention relates to a high frequency power amplifier for switching the routes in an amplifier according to output powers.

2. Background Art

A high frequency power amplifier operating in a high-frequency band of several tens of megahertz is used in mobile telephones and mobile terminals. In this high frequency power amplifier, the route in the amplifier is switched each time for obtaining the high power output of 28.25 dBm, the middle power output of 17 dBm, and the low power output of 7 dBm. Thereby, the operation efficiency at each output power can be improved (for example, refer to "Proceedings of the 36th European Microwave Conference", P. 348-P. 351).

In conventional high frequency power amplifiers, in common routes when low and middle power outputs are obtained, impedance matching has been performed by a switching element and a capacitor connected in parallel.

SUMMARY OF THE INVENTION

However, since the switching element and the capacitor are connected in parallel, only the switching of impedance matching could be performed, and the simultaneous switching of routes has not been available. Therefore, there has been a problem wherein the freedom of circuits has been low.

To solve the above mentioned problem, the object of the present invention is to obtain a high frequency power amplifier wherein the switching of the impedance matching and the switching of routes can be performed simultaneously and the freedom of circuit designs can be improved.

According to the present invention, a high frequency power amplifier includes: a first transistor amplifying a high-frequency signal inputted from outside; a second transistor amplifying an output signal of the first transistor; a third transistor connected in parallel to the first transistor and amplifying a high-frequency signal inputted from outside; a first switching element connected between an output of the first transistor and an input of the second transistor; a second switching element connected between an output of the third transistor and the first switching element; third and forth switching elements connected in series between the output of the first transistor and an output of the second transistor and between the second switching element and the output of the second transistor; and a first capacitor connected between the third switching element and the fourth switching element.

The present invention makes it possible to obtain a high frequency power amplifier wherein the switching of the impedance matching and the switching of routes can be performed simultaneously and the freedom of circuit designs can be improved.

Other and further objects, features and advantages of the invention will appear more fully from the following description.

DETAILED DESCRIPTION OF THE PREFERRED EMBODIMENTS

A high frequency power amplifier according to the embodiments of the present invention will be described with reference to the drawings. The same components will be denoted by the same symbols, and the repeated description thereof may be omitted.

First Embodiment

Figure 1:
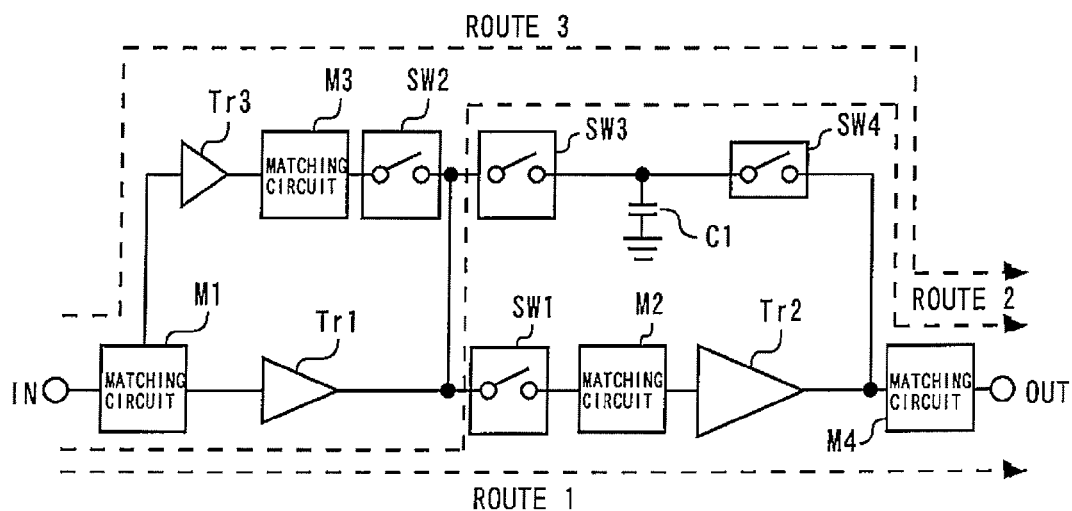
FIG. 1 is a diagram showing a high frequency power amplifier according to the first embodiment of the present invention.

FIG. 1 is a diagram showing a high frequency power amplifier according to the first embodiment of the present invention. A transistor Tr1 amplifies the high-frequency signals inputted from outside. A transistor Tr2 amplifies the output signals of the transistor Tr1. A transistor Tr3 is connected in parallel to the transistor Tr1, and amplifies the high-frequency signals inputted from outside.

An input matching circuit M1 interfaces respective input impedances of the transistors Tr1 and Tr3. An inter-stage matching circuit M2 interfaces the output impedance of the transistor Tr1 and the input impedance of the transistor Tr2. A pre-matching circuit M3 interfaces the output impedance of the transistor Tr3 to the characteristic impedance. An output matching circuit M4 interfaces the output impedances of the transistors Tr1, Tr2, and Tr3 to the characteristic impedance.

A switching element SW1 is connected between the output of the transistor Tr1 and the input of the transistor Tr2. A switching element SW2 is connected between the output of the transistor Tr3 and the switching element SW1. Switching elements SW3 and SW4 are connected in series between the output of the transistor Tr1 and the output of the switching element SW2, and the transistor Tr2.

A capacitor C1 is connected between the switching element SW3 and the switching element SW4. An end of the capacitor C1 is connected to the connecting point between the switching element SW3 and the switching element SW4. The other end of the capacitor C1 is grounded. The capacitor C1 is a pre-matching circuit to interface the output impedances of the transistor Tr1 and Tr2 to the characteristic impedance.

Next, the operation of the high frequency power amplifier according to the present embodiment will be described. In the case where high power output of 17 dBm or higher is to be obtained, the switching element SW1 is turned on, and the switching elements SW2, SW3, and SW4 are turned off to make the route 1 be effective. The transistor Tr3 is turned off. The signals inputted to the input terminal IN are amplified by the transistor Tr1, and the output signals of the transistor Tr1 are amplified by the transistor Tr2 to be outputted from the output terminal OUT.

In the case where middle power output of 7 to 17 dBm is to be obtained, the switching elements SW1 and SW2 are turned off, and the switching elements SW3 and SW4 are turned on to make the route 2 be effective. The transistors Tr2 and Tr3 are turned off. The signals inputted to the input terminal IN are amplified by the transistor Tr1 to be outputted from the output terminal OUT.

In the case where low power output of 7 dBm or lower is to be obtained, the switching element SW1 is turned off, and the switching elements SW2, SW3, and SW4 are turned on to make the route 3 be effective. The signals inputted to the input terminal IN are amplified by the transistor Tr3 to be outputted from the output terminal OUT.

In the present embodiment, as described above, the pre-matching circuit using the capacitor C1 is connected to the switching element SW3 in series. Thereby, at the same time as route switching to make the route 2 and the route 3 effective, the switching of impedance matching using the capacitor C1 can be performed. As a result, the freedom of circuit designs can be improved.

Second Embodiment

Figure 2:
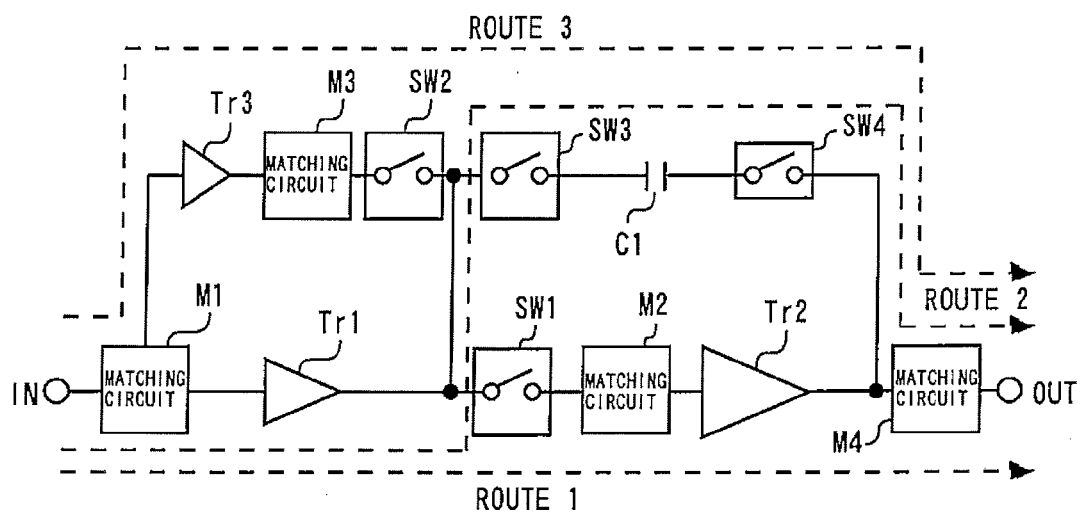
FIG. 2 is a diagram showing a high frequency power amplifier according to the second embodiment of the present invention.

FIG. 2 is a diagram showing a high frequency power amplifier according to the second embodiment of the present invention. An end of the capacitor C1 is connected to the switching element SW3, and the other end of the capacitor C1 is connected to the switching element SW4. In other words, in the pre-matching circuit, the capacitor C1 is connected in series. Other constitutions are identical to the constitutions of the first embodiment.

Conventionally, since the switching element and the capacitor are connected in parallel, serial component elements could not be used. Whereas in the present embodiment, since the pre-matching circuit is connected in series to the switching element SW3, the capacitor C1 connected in series can be used. In this case also, the identical effect to the effect of the first embodiment can be obtained.

Third Embodiment

Figure 3:
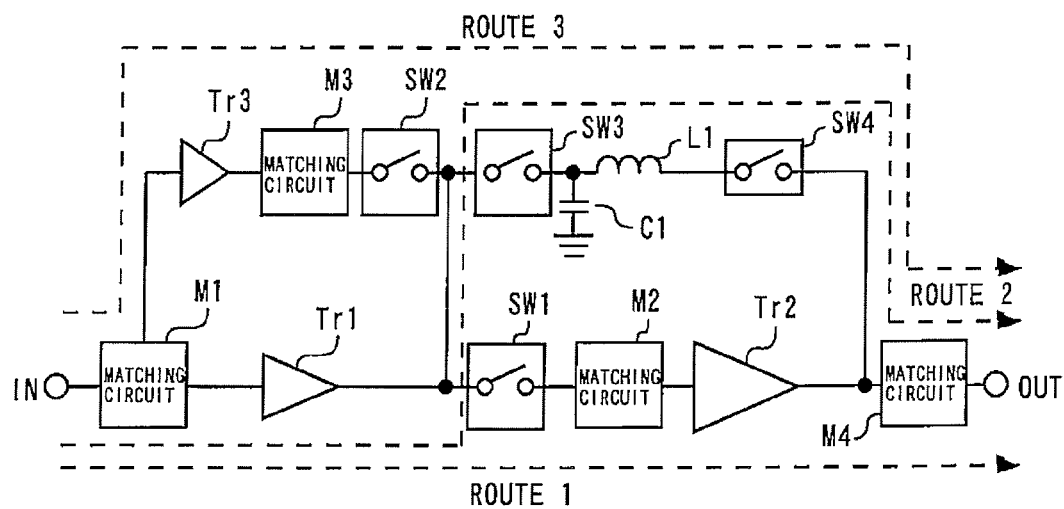
FIG. 3 is a diagram showing a high frequency power amplifier according to the third embodiment of the present invention.

FIG. 3 is a diagram showing a high frequency power amplifier according to the third embodiment of the present invention. Between the switching element SW3 and the switching element SW4, an inductor L1 is connected in series to the capacitor C1. Other constitutions are identical to the constitutions of the first embodiment. Thereby, the freedom of impedance matching of the route 2 and the route 3 is enhanced, and the operation efficiency of the transistors Tr1 and Tr3 can be improved.

Fourth Embodiment

Figure 4:
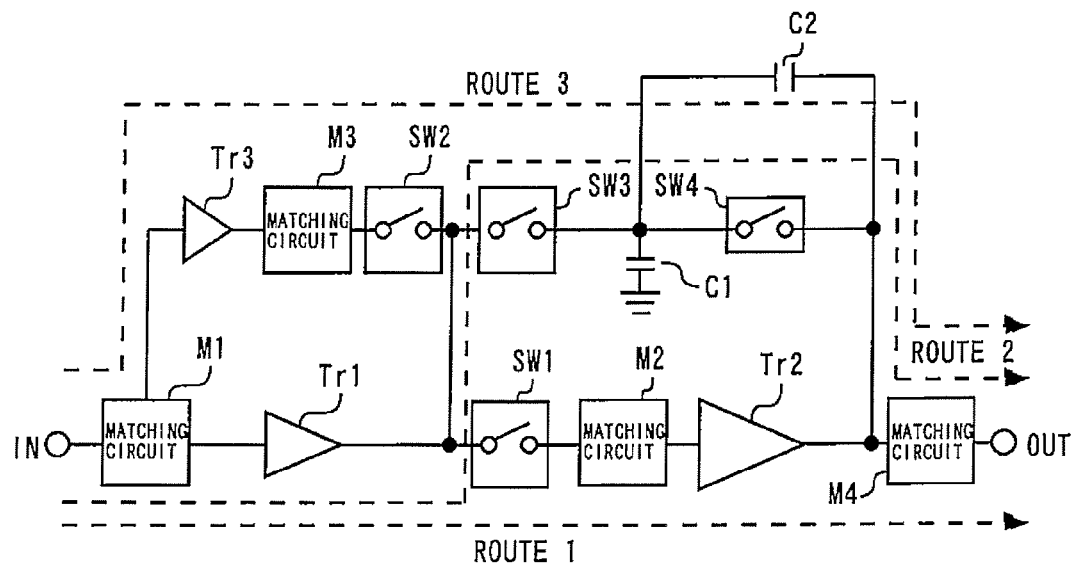
FIG. 4 is a diagram showing a high frequency power amplifier according to the fourth embodiment of the present invention.

FIG. 4 is a diagram showing a high frequency power amplifier according to the fourth embodiment of the present invention. A capacitor C2 is connected in parallel to the switching element SW4 between the output of the transistor Tr2 and the capacitor C1. Other constitutions are identical to the constitutions of the first embodiment. Since the capacitor C2 is operated as the pre-matching circuit operating only in the high-power operations, the saturation output power of the transistor Tr2 can be improved.

Fifth Embodiment

Figure 5:
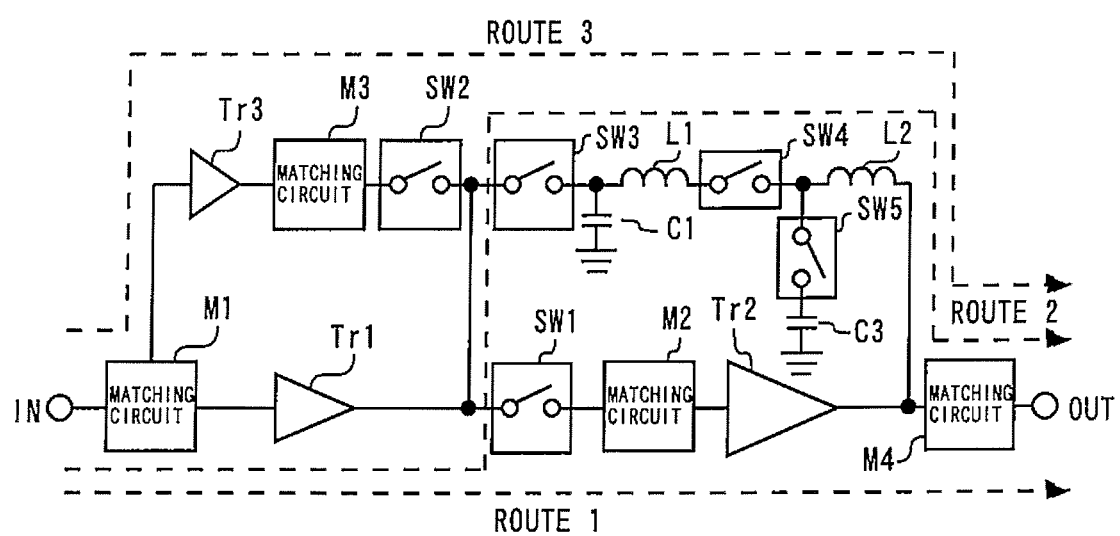
FIG. 5 is a diagram showing a high frequency power amplifier according to the fifth embodiment of the present invention.

FIG. 5 is a diagram showing a high frequency power amplifier according to the fifth embodiment of the present invention. Between the output of the transistor Tr2 and the grounding point, a switching element SW5 and a capacitor C3 are connected in series. An inductor L2 is connected between the transistor Tr2 and the fourth switching element. Other constitutions are identical to the constitutions of the second embodiment. Thereby, since the impedance matching of the route 2 and the route 3 can be switched in two steps, the operation efficiency of the transistor Tr1 can be improved.

Table 1 is a comparison table showing the operation efficiency of a conventional high frequency power amplifier, and the operation efficiency of the high frequency power amplifier according to the fifth embodiment, in the case of the middle power output of 17 dBm. In the fifth embodiment, as is seen in Table 1, the operation efficiency can be elevated by 3% in comparison to conventional arts.

TABLE 1

|  | the operation efficiency in the case of the middle power output of 17 dBm |
|---|---|
| conventional high frequency power amplifier | 17% |
| high frequency power amplifier according to the fifth embodiment | 20% |

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2011-112224, filed on May 19, 2011 including specification, claims, drawings, and summary, on which the Convention priority of the present application is based, is incorporated herein by reference in its entirety.

What is claimed is:

1. A high frequency power amplifier comprising:
    a first transistor for amplifying an input high-frequency signal;
    a second transistor for amplifying an output signal of the first transistor;
    a third transistor connected in parallel with the first transistor and for amplifying the input high-frequency signal;
    a first switching element connected between an output of the first transistor and an input of the second transistor;
    a second switching element connected between an output of the third transistor and the first switching element;
    third and fourth switching elements connected in series between the output of the first transistor and an output of the second transistor, and between the second switching element and the output of the second transistor; and
    a first capacitor connected between the third switching element and the fourth switching element.

2. The high frequency power amplifier according to claim 1, wherein a first end of the first capacitor is connected to a connecting point between the third switching element and the fourth switching element, and a second end of the first capacitor is grounded.

3. The high frequency power amplifier according to claim 1, wherein a first end of the first capacitor is connected to the third switching element, and a second end of the first capacitor is connected to the fourth switching element.

4. The high frequency power amplifier according to claim 1, further comprising an inductor connected in series with the first capacitor between the third switching element and the fourth switching element.

5. The high frequency power amplifier according to claim 1, further comprising a second capacitor connected in parallel with the fourth switching element and between the output of the second transistor and the first capacitor.

6. The high frequency power amplifier according to claim 1, further comprising a fifth switching element and a second capacitor connected in series between the output of the second transistor and a grounding point.

* * * * *